United States Patent
Winter et al.

(10) Patent No.: US 6,707,936 B1
(45) Date of Patent: Mar. 16, 2004

(54) METHOD AND APPARATUS FOR PREDICTING DEVICE YIELD FROM A SEMICONDUCTOR WAFER

(75) Inventors: Thomas W. Winter, McKinney, TX (US); Thomas K. Powell, Jr., Plano, TX (US); Steven M. James, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/521,563

(22) Filed: Mar. 9, 2000

Related U.S. Application Data

(60) Provisional application No. 60/129,801, filed on Apr. 16, 1999.

(51) Int. Cl.$^7$ ................................................ G06K 9/00
(52) U.S. Cl. ...................... 382/149; 382/145; 382/147
(58) Field of Search ................................. 382/141, 145, 382/147, 149, 150, 152, 228, 307; 356/137.2; 214/238; 700/100, 110, 121; 702/85, 185; 703/6, 13, 14

(56) References Cited

U.S. PATENT DOCUMENTS

| | | | |
|---|---|---|---|
| 4,776,023 A | * 10/1988 | Hamada et al. | 382/147 |
| 5,475,695 A | * 12/1995 | Caywood et al. | 714/738 |
| 5,754,432 A | 5/1998 | Komatsuzaki et al. | 700/100 |
| 5,828,778 A | * 10/1998 | Hagi et al. | 382/145 |
| 5,991,699 A | * 11/1999 | Kulkarni et al. | 702/83 |
| 6,047,083 A | * 4/2000 | Mizuno | 382/141 |

OTHER PUBLICATIONS

Cunningham J.A. ("The Use and Evaluation of Yield Models in Integrated Circuit Manufacturing", IEEE Transactions on Semiconductor Manufacturing, vol. 3, No. 2, May 1990, pp.: 60–71).*

Cunningham S.P. ("Semiconductor Yield Improvement Results and Best Practices", IEEE Transactions on Semiconductor Manufacturing, vol. 8, No. 2, May 1995, pp.: 103–109).*

Shahsavari et al. ("IC Yield Modeling and Statistical Circuit Simulation", Southcon/94 Conference Record, Mar. 1994, pp.: 594–598).*

* cited by examiner

*Primary Examiner*—Leo Boudreau
*Assistant Examiner*—Duy M. Dang
(74) *Attorney, Agent, or Firm*—Yingsheng Tung; Wade James Brady, III; Frederick J. Telecky, Jr.

(57) ABSTRACT

Device design information (18) for a semiconductor device is used to generate theoretical probability of failure information (21), which represents the probability that a manufacturing defect will cause an electrical failure in an actual device fabricated according to the design information. An actual wafer (23), which contains a plurality of devices (22) manufactured according to the design information, is inspected for actual defects (25). The probability of failure information is then used to determine for each of several detected defects a corresponding probability value. Then, the individual probability values for the respective defects are combined in order to obtain a composite failure probability, which serves as a basis for evaluating the expected yield of operational devices from the particular wafer.

13 Claims, 3 Drawing Sheets

US 6,707,936 B1

METHOD AND APPARATUS FOR PREDICTING DEVICE YIELD FROM A SEMICONDUCTOR WAFER

This application claims priority under 35 USC §119(e)(1) of provisional application No. 60/129,801 filed Apr. 4, 1999.

TECHNICAL FIELD OF THE INVENTION

This invention relates in general to semiconductor wafer fabrication and, more particularly, to a method for predicting how many operable devices will be obtained from a given semiconductor wafer in light of defects therein.

BACKGROUND OF THE INVENTION

As electronic systems have continued to grow in importance in modern society, the need for effective fabrication of the semiconductor devices underlying the electronic systems has also grown. The increased need for semiconductor fabrication abilities has also increased the requirements for monitoring the fabrication process. In this regard, as the level of integration increases, the size of the semiconductor devices decreases. As a result, a defect of a given size has an increasingly greater potential for causing a potential failure of a device, such as a short or an interruption of electrical continuity. Consequently, it is important to have information about how many semiconductor devices on a given semiconductor wafer will have to be scrapped because they are inoperable, due to defects introduced in the manufacturing process.

One traditional method of measuring device yields from fabricated semiconductor wafers has involved generating a histogram based on production inspection of the wafers. The histograms show the number of defects on the wafer for each of several defect size ranges. Probability of failure information is estimated based on the design of the devices on the wafer, and a graph curve of this probability of failure information is manually overlaid on the histogram. The histogram with the overlaid probability of failure information are used to estimate a device yield rate for a wafer embodying a particular device design. One of the problems with this known technique is that the number of predicted failures for a given design may be overstated, due to defects being counted multiple times, for example where each layer is inspected after its fabrication and a single defect in one layer is picked up by inspections for that layer and other layers. In addition, this known technique evaluates failure only at the wafer level, and makes no device specific inquiries.

SUMMARY OF THE INVENTION

From the foregoing, it may be appreciated that a need has arisen for a method and apparatus for accurately predicting how many operable devices will be obtained from a given semiconductor wafer in light of defects therein.

According to the present invention, a method and apparatus are provided to address this need and involve using design information to generate further information which defines a probability of failure as a function of a defect characteristic for potential defects, and inspecting a part fabricated according to the design information to identify defects therein and at least one characteristic of each defect. The method and apparatus further involve generating a list of defect characteristics which each correspond to a respective defect detected in the part in the inspecting step, using each defect characteristic in the list to determine from the further information a respective corresponding defect failure probability, and combining the defect failure probabilities to determine a survival probability.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
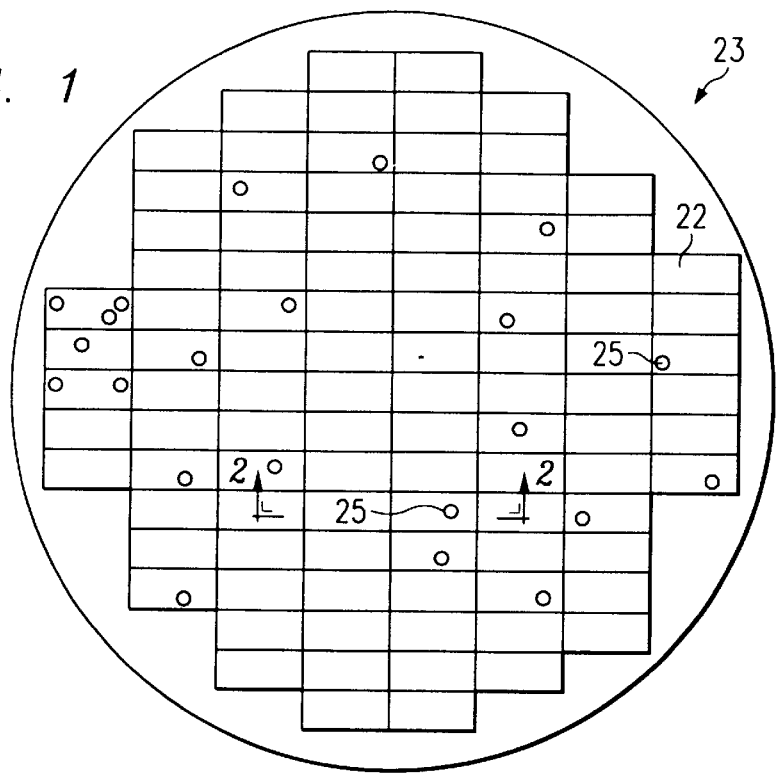
FIG. 1 is a diagrammatic top view of a semiconductor wafer which is one example of various wafers that may be evaluated according to the present invention.

FIG. 1 is a diagrammatic top view of a wafer 23 which is one example of various semiconductor wafers that may be evaluated according to the present invention. The wafer 23 includes a plurality of semiconductor devices 22 which are each fabricated according to device design information. One example of device design information is shown diagrammatically at 18 in FIG. 3 and is discussed later, but the present invention is not limited to any particular wafer or device design. In the disclosed wafer 23, each of the devices 22 is fabricated using the same device design information.

Figure 2:
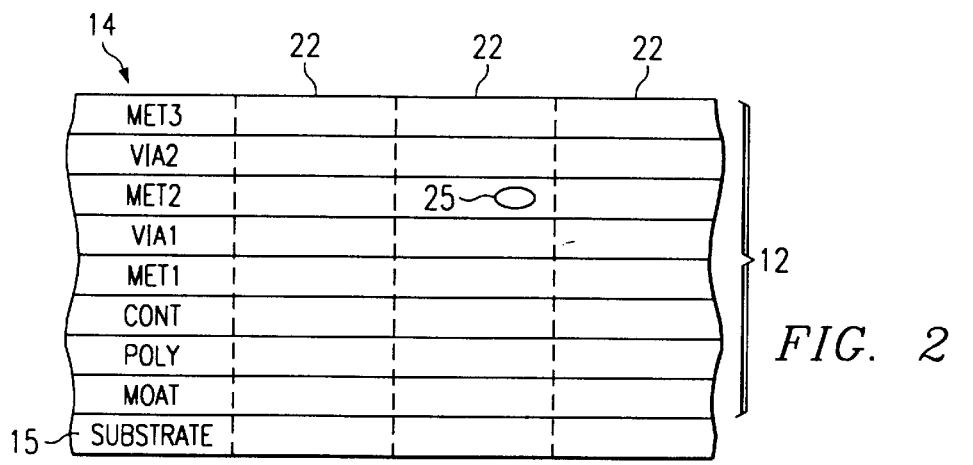
FIG. 2 is a diagrammatic cross sectional view of the wafer of FIG. 1, taken along the line 2—2 in FIG. 1 and showing a plurality of layers and a plurality of devices in the wafer.

FIG. 2 is a diagrammatic cross-sectional view of the wafer 23, showing a plurality of layers 12 therein, and showing several of the semiconductor devices 22 therein. Each semiconductor device. 22 is created in a known manner on a substrate 14 by fabricating the layers 12 from various known conducting, insulating and semiconducting materials 14 to form the various electronic components that make up each semiconductor device 22. In the disclosed embodiment these layers 12 include MOAT, POLY, CONT, MET1, VIA1, MET2, VIA2, and MET3 layers, which are types of layers known to those skilled in the art.

A plurality of defects 25 may be introduced into the layers 12 of the semiconductor devices 22 during the fabrication process. Each device 22 may experience electrical failure which renders the device 22 inoperative, due to the defect or defects 25 therein. Each defect 25 has associated characteristics, such as a size of the defect 25, the layer 12 where the defect 25 occurs, and a location on the layer 12 of the defect 25.

Figure 3:
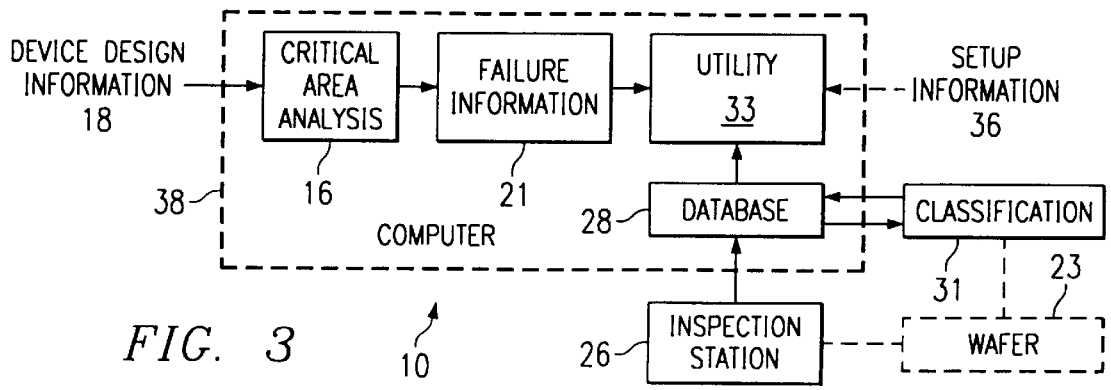
FIG. 3 is a block diagram of a yield prediction system which embodies the present invention.

FIG. 3 is a block diagram of a yield prediction system 10. The yield prediction system 10 includes a critical area analysis section 16, which uses the device design information (depicted at 18) in order to generate probability of failure information 21 for the semiconductor devices described by the device design information 18. In the disclosed embodiment, the critical area analysis section 16, the failure information 21, a database 28 and a utility 33 are implemented on a computer 38.

The techniques used by the critical area analysis section 16 are known, but are described here briefly for purposes of convenience and completeness. More specifically, the critical area analysis section 16 uses the device design information 18 to generate a simulated semiconductor device conforming to that design information. The critical area analysis section 16 then analyzes a plurality of simulated defects which could potentially be introduced into the layers of the simulated semiconductor device during an actual fabrication process. The critical area analysis section 16 of the disclosed embodiment uses Monte Carlo analysis to estimate the electrical failure probability, but other methods known in the art, such as shapes expansion, may alternatively be used. Monte Carlo analysis randomly distributes a plurality of simulated defects of various sizes on each of the layers of the simulated device. The critical area analysis section 16 then analyzes the simulated defects, in order to determine the probability that each simulated defect, based on its size and location, would cause a failure in the specific circuit represented by the particular design information. Section 16 generates separate probability of failure information 21 for each layer in the device. This probability information for each of the defects in a given layer is then combined in order to obtain the probability of failure information 21 for that layer.

In more detail, by using the device design information 18, the critical area analysis section 16 can determine whether each simulated defect would interact with one or more electrical components or interconnections formed in the layers of the simulated device and whether the interaction will cause an electrical failure, such as a short or interruption of electrical continuity. This critical area analysis is performed individually for each layer in the simulated device. The failure information 21 generated by the critical area analysis section 16 for each layer relates the size of the simulated defects to the probability of a failure in that layer.

Figure 4:
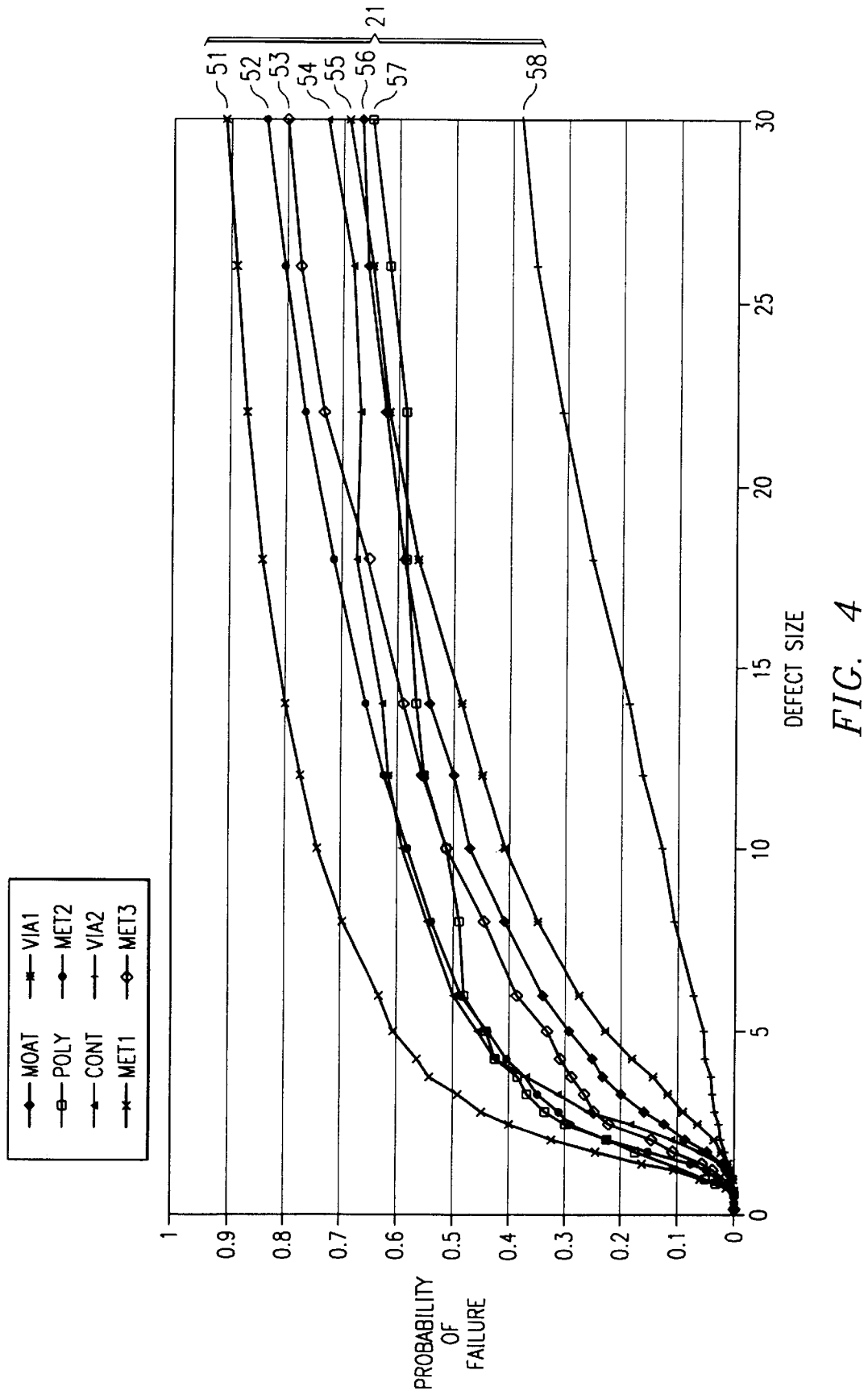
FIG. 4 is a graph showing probability of failure information for several layers of the wafer of FIG. 1.

FIG. 4 is a graph showing an example of probability of failure information 21 for each of the layers 12 of the wafer 23 shown in FIGS. 1 and 2. In particular, the failure information 21 includes a plurality of graph curves 51–58, which each correspond to a respective layer 12 in FIG. 2, and which relate the probability of electrical failure in that layer to the sizes of defects 25. In the disclosed embodiment, the failure information 21 is stored as a lookup table, but it is shown graphically in FIG. 4 for purposes of clarity. As discussed in more detail below, the failure information 21 may be used in conjunction with inspection information from an actual device 22 having actual defects 25 in order to determine the failure probability of the actual device 22.

Referring again to FIG. 3, an inspection station 26 is used to inspect each layer 12 of the wafer 23. The inspection station 12 is a commercially available device with which those skilled in the art are already familiar, but it :is briefly described here for purposes of completeness. A subset of wafers from a production batch is selected for inspection, the wafer 23 of FIGS. 1–2 being one example of such a wafer. The inspection station 26 performs a separate inspection for each layer 12 of the wafer 23, after each respective layer has been fabricated. The inspection station 26 is used to detect the defects 25 introduced into the layers 12 of the devices 22 on the wafer 23 during the fabrication process. The inspection station 26 also detects the size of each defect 25, and location on the layer 12 of each defect 25. The defects and the associated characteristics detected by the inspection station 26 are all stored in the database 28. The database 28 stores the result of multiple past inspections of various different wafers 23 inspected by the inspection station 26.

A classification station 31 associates a classification with each defect 25, and the classification associated with the defect 25 is stored in the database 28 with the other information for that defect 25. In the disclosed embodiment of the present invention, the classification is determined by having a human operator use a microscope to visually inspect the actual defects 25 in each layer 12 of the wafer 23, using the defect location information from the database to visually locate each defect. Based on this visual inspection, the human operator manually assigns a classification to each defect 25. For example, a defect may be classified as an excursion defect, which may be a repeating defect caused by the failure of a specific piece of equipment. Alternatively, it may be classified as a nuisance defect, such as a color variation. Any of a variety of other suitable and well-known classifications may be used as well.

The utility 33 is a program which uses the failure information 21 and the database 28 in order to predict a survival probability for each device 22. The operation of the utility 33 is described in more detail later in association with FIG. 5. Setup information 36 is used to control and refine the operation of the utility 33. The setup information 36 is obtained from an operator, for example through command line parameters, or through a graphical user interface (GUI). The setup information 36 allows operator control of which defects 25 and which defect characteristics the utility 33 should use in predicting the survival probability. For example, the setup information 36 may restrict the utility 33 to using only new defects which were not present in the prior layer or layers, random defects, repeating defects, defects within a particular area, or some combination thereof. The setup information 36 may also be used to instruct the utility 33 to ignore defects 25 of various classifications, such as nuisance defects. The setup information 36 may also be used to select which of the many wafer inspections stored in the database 28 to make a prediction for. For example, the setup information 36 may restrict the utility 33 to use of wafers 23 from a particular date range, those that match a particular pattern, those which are in certain production lots, or some other combination thereof.

Figure 5:
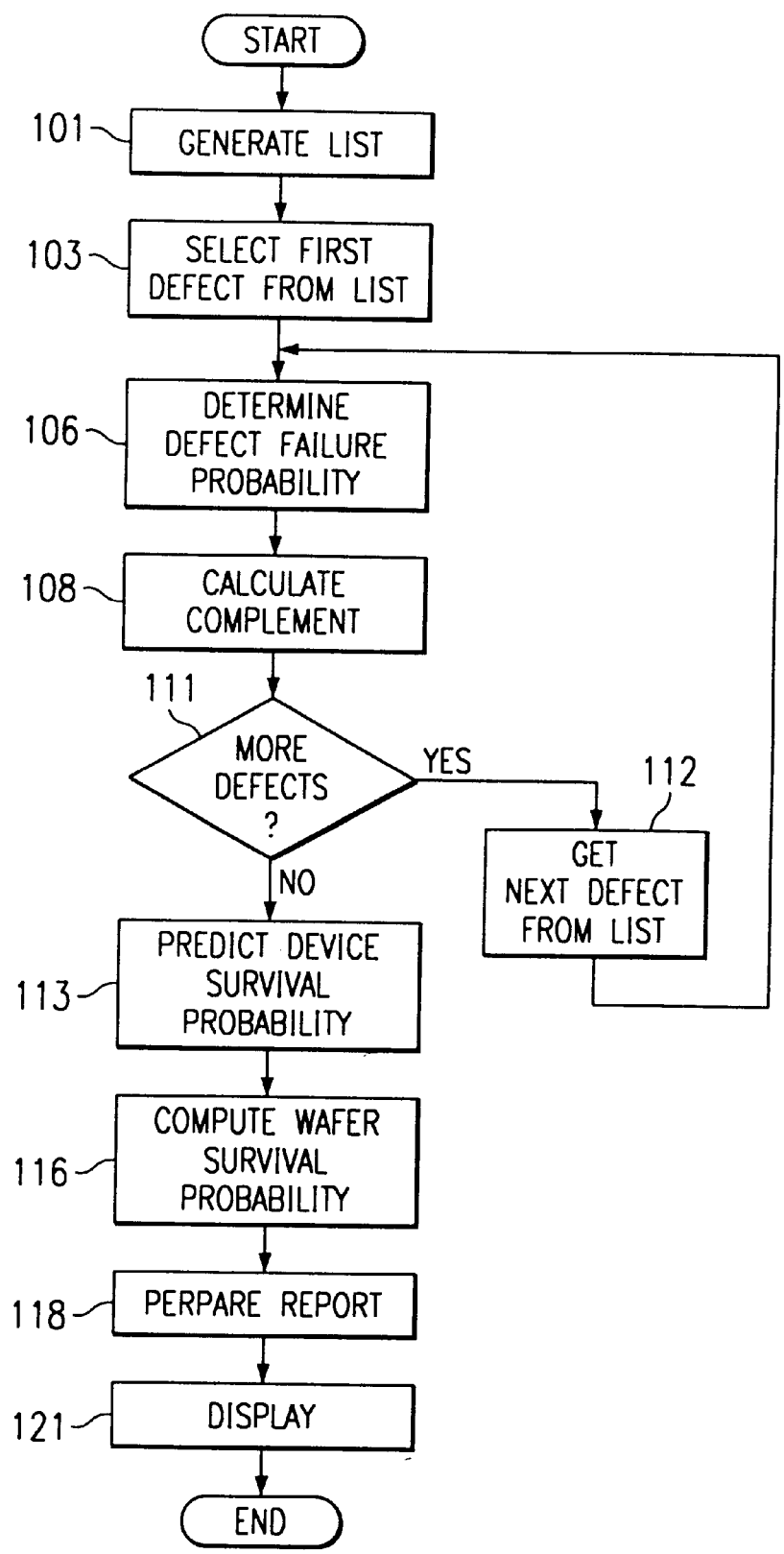
FIG. 5 is a flowchart showing the operation of a utility which is part of the system of FIG. 3 and which predicts survival or yield information for wafers such as the wafer shown in FIG. 1.

FIG. 5 is a flowchart showing the operation of the utility 33. The operation begins at block 101, where the utility 33 generates from the information in the database 28 a list of defects 25 and associated defect characteristics. The selection of the defects 25 and defect characteristics for the list may be controlled based on various filtering criteria, such as the criteria specified in the setup information 36. The filtering criteria acts to limit and control which defects 25 and associated defect characteristics are used by the utility 33. The filtering criteria may also filter based on the size of the defect, the layer where the defect is located, the location of the defect within the layer, whether or not the defect repeats from device 22 to device 22, and various other characteristics. Only defects which satisfy the filtering criteria are included in the list.

Next, at block 103, the utility 33 selects the first defect 25 and defect characteristic from the list.

Proceeding to block 106, the probability of failure for the selected defect 25 is calculated. The probability of failure for the selected defect 25 is calculated by using the size of the defect to look up the failure information 21 for the respective layer 12 having the defect 25. For example, referring to FIG. 4, a defect of size 10 in the VIA1 layer would have a probability of failure slightly higher than 0.4.

Then, at block 108, the complement of the defect failure probability calculated in block 106 is determined. The complement is calculated by taking one minus the failure probability determined in block 106. The complement calculated in step 108 is then stored for later use, as discussed below.

Next, control proceeds to decisional block 111. If there are any more defects which remain in the list and need to be handled, then the YES branch of decisional block 111 is followed, the next successive defect in the list is selected at block 112, and control returns to block 106. Alternatively, if there are no more defects in the list which still need to be handled, then the NO branch of decisional block 111 is followed and control proceeds to block 113.

At block 113 the survival probability for each device is computed. The survival probability is found by taking the product of all of the complements from block 108 for a given device 22. Depending on the setup information 36, this may represent defects for that device for only one layer, or defects in all layers. The survival probability represents the probability that the device 22 will properly operate with the defects in that device which are in the list generated by block 101.

Proceeding to block 116, a wafer survival probability is computed. The wafer survival probability is found by computing the average of the survival probabilities for all of the devices 22 on the wafer 23. Depending on the setup information 36, the survival probability for each device may represent all of the defects for that device in all layers, or only the defects for that device in one layer, and so forth.

Next, at block 118, a report is prepared. The report contains each device survival probability computed in block 113, and the wafer survival probability computed in block 116. At block 121 the report prepared at block 118 is displayed to the user, for example by printing it out.

The present invention provides a number of technical advantages. One such technical advantage is the capability for an on-the-fly evaluation of probable device yield from a wafer, which results in cost savings by permitting low-yield wafers to be scrapped early in the fabrication process. Another advantage is more accurate determination of the device yield rate for wafers. A further advantage is that analysis is carried out on a defect-by-defect basis and also on a device-by-device basis. A further advantage is the ability to identify the particular layer having the lowest yield, so that the cause of the defects can be more accurately determined, and changes made to the fabrication process for that layer. Conversely, the invention can be used to measure the effectiveness of a change in the process used to fabricate a given layer. In a situation where the calculated yield is better than the actual yield, it may indicate that further study should be focused on the fabrication process itself, rather than on defects. Using these techniques, production yields for new products can be improved more quickly than with prior techniques. A further advantage is that the techniques according to the invention are compatible with existing defect databases.

Although one embodiment has been illustrated and described in detail, it should be understood that various changes, substitutions and alterations may be made therein without departing from the scope of the present invention. For example, although the disclosed embodiment describes analysis of particular types of layers, any suitable composition or type of layer used in fabricating semiconductor devices may be used. In addition, although the specific examples given for defect classifications include excursion defects and nuisance defects, many other additional defect classifications may be used. Further, the specific techniques set forth for combining the failure probabilities determined for respective single defects are not limiting, and there are numerous other ways in which the failure probabilities for individual defects may be combined. Moreover, the failure probabilities for individual defects are determined in the disclosed embodiment as a function of the size of the defects, but it will be recognized that it would be determined as a function of another characteristic, or a combination of characteristics. Other changes, substitutions and alterations are also possible without departing from the spirit and scope of the present invention, as defined by the following claims.

What is claimed is:

1. A method comprising:
   using design information to generate further information defining a probability of failure as a function of a defect characteristic includes the defect size for potential defects, the further information including a relation between the defect size and a probablility of electrical failure;
   inspecting a part fabricated according to the design information to identify defects therein and at least one characteristic of each defect;
   generating a list of defect characteristics which each correspond to a respective defect detected in the part in said inspecting step;
   using each defect characteristic in the list to determine from the further information a respective corresponding defect failure probability; and
   combining the defect failure probabilities to determine a composite failure probability.

2. A method according to claim 1, wherein the part includes a plurality of layers and the further information includes a plurality of the relations, each relation corresponding to a respective one of the layers.

3. A method according to claim 2, further including carrying out said inspecting, generating, using and combining steps for each layer in the part.

4. A method according to claim 1, wherein said inspecting step includes associating a size characteristic with each of the detected defects, the size characteristic representing the physical size of each defect detected in said inspecting step, and wherein the generating-a-list step includes filtering the defects based on a predetermined criteria such that the list includes defect characteristics associated with a subset of the defects detected.

5. A method according to claim 4, wherein said combining step includes:
   determining a complement of each of the defect failure probabilities for the defect characteristics in the list; and
   computing a product of the complements.

6. A method according to claim 4 wherein said combining step includes:
   determining a complement of each of the defect failure probabilities for the defect characteristics in the list;
   computing for each of a plurality of different portions of the part a product of the complements for each of the defect characteristics in the list that correspond to defects located in that respective portion of the part; and
   computing an average of the products for the respective portions of the part.

7. A method according to claim 6 further including preparing a report which embodies the products and the average, and displaying the report.

8. A method comprising:
   using design information to generate further information defining a probability of failure as a function of a defect characteristic of potential defects, the further information includes a relation between a size characteristic and a probability of electrical failure;

inspecting a part fabricated according to the design information to identify defects therein and at least one characteristic of each defect;

filtering the identified defects based on a predetermined criteria to identify a subset of the identified defects;

generating a list including defect characteristics associated with the subset of the identified defects, wherein the defect characteristics include a size characteristic representing the size of each defect in the subset;

accessing the further information using each size characteristic in the list to generate a defect failure probability for each size characteristic; and combining the defect failure probabilities to determine a composite failure probability.

9. A method according to claim 8, wherein said combining step includes:

determining a complement of each of the defect failure probabilities for the defect characteristics in the list; and computing a product of the complements.

10. A method according to claim 9, wherein the part includes a plurality of layers and the further information includes a plurality of the relations, each relation corresponding to a respective one of the layers.

11. An apparatus comprising:

a storage medium operable to store probability of failure information which is derived from design information and which defines a probability of failure as a function of a defect characteristic of potential defects, including a size characteristic representing the physical size of the defect associated therewith, the probability of failure information stored in said storage medium including a relation between the size characteristic and a probability of electrical failure;

an inspection station operable for facilitating inspection of a part fabricated according to the design information in order to identify defects therein and at least one characteristic of each defect; and a processing section operatively coupled to said storage medium and said inspection station, and operable to:

generate a list of defect characteristics which each correspond to a respective defect detected in the part at said inspection station;

use each defect characteristic in the list to determine from the further information a respective corresponding defect failure probability; and combine the defect failure probabilities to determine a composite failure probability.

12. An apparatus according to claim 11, wherein said processing section is operable to effect the combining of the defect failure probabilities by:

determining a complement of each of the defect failure probabilities for the defect characteristics in the list; and computing a product of the complements.

13. An apparatus according to claim 12, wherein the part includes a plurality of layers, and wherein the probability of failure information stored in the storage medium includes a plurality of the relations, each relation corresponding to a respective one of the layers.

* * * * *